US012653033B2

(12) United States Patent
Zeng et al.

(10) Patent No.: US 12,653,033 B2
(45) Date of Patent: Jun. 9, 2026

(54) CHIP PACKAGE STRUCTURE AND MANUFACTURING METHODS FOR THE SAME

(71) Applicant: Yangtze Memory Technologies Co., LTD., Wuhan (CN)

(72) Inventors: Xinru Zeng, Wuhan (CN); Xin Feng, Wuhan (CN); Peng Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 442 days.

(21) Appl. No.: 18/324,009

(22) Filed: May 25, 2023

(65) Prior Publication Data

US 2024/0290727 A1      Aug. 29, 2024

(30) Foreign Application Priority Data

Feb. 27, 2023      (CN) .......................... 202310184401.6

(51) Int. Cl.
| | |
|---|---|
| *H01L 23/552* | (2006.01) |
| *H10W 42/20* | (2026.01) |
| *H10W 70/685* | (2026.01) |
| *H10W 74/01* | (2026.01) |
| *H10W 74/10* | (2026.01) |

(Continued)

(52) U.S. Cl.
CPC ......... *H10W 42/20* (2026.01); *H10W 70/685* (2026.01); *H10W 74/014* (2026.01); *H10W 74/117* (2026.01); *H10W 90/00* (2026.01); *H10W 90/701* (2026.01);

(Continued)

(58) Field of Classification Search
CPC . H01L 23/552; H01L 21/561; H01L 23/3128; H01L 23/49816; H01L 24/32; H01L 24/83; H01L 25/0657; H01L 2224/32145; H01L 2224/32225; H01L 2224/838; H01L 2225/06562; H01L 23/3135; H01L 2224/48145; H01L 23/5385; H01L 23/49827; H01L 2224/16145; H01L 2224/0603; H01L 23/28; H01L 23/3121; H01L 23/3675; H01L 25/0753; H01L 23/5384; H01L 21/56; H01L 21/563; H01L 21/565; H01L 23/3107
See application file for complete search history.

(56) References Cited

U.S. PATENT DOCUMENTS

| | | | | |
|---|---|---|---|---|
| 11,450,583 | B2 * | 9/2022 | Choi | ................... H10W 74/117 |
| 2002/0140108 | A1 * | 10/2002 | Johnson | .............. H10W 74/012 |
| | | | | 257/710 |

(Continued)

*Primary Examiner* — Niki H Nguyen
(74) *Attorney, Agent, or Firm* — Hanley, Flight & Zimmerman, LLC

(57) ABSTRACT

The present application provides chip package structures and manufacturing methods thereof. In one example, the chip package structure includes: a base board including a grounding pad; a chip assembly located at a first surface of the base board; a package body covering the chip assembly, wherein a side wall of the package body is located in an extension direction of a side wall of the base board, and the side wall of the package body and the first surface of the base board have an acute included angle therebetween; and a shielding layer covering the side walls of the package body and the base board and electrically connected with the grounding pad.

20 Claims, 6 Drawing Sheets

<u>1000</u>

(51) Int. Cl.
　　　*H10W 90/00*　　　　(2026.01)
　　　*H10W 72/00*　　　　(2026.01)
　　　*H10W 90/24*　　　　(2026.01)

(52) U.S. Cl.
　　　CPC ...... *H10W 72/07331* (2026.01); *H10W 90/24*
　　　　　　(2026.01); *H10W 90/732* (2026.01); *H10W*
　　　　　　　　　　　　　　　　　*90/734* (2026.01)

(56)　　　　　　　　References Cited

U.S. PATENT DOCUMENTS

2015/0303075 A1* 10/2015 Han ...................... H10W 74/01
　　　　　　　　　　　　　　　　　　　　　438/113
2016/0276288 A1*　9/2016 Lee ....................... H10W 42/20

* cited by examiner

1000

2000

CHIP PACKAGE STRUCTURE AND MANUFACTURING METHODS FOR THE SAME

CROSS-REFERENCE TO RELATED APPLICATION

This application claims priority to and the benefit of Chinese Patent Application 202310184401.6, filed on Feb. 27, 2023, which is hereby incorporated by reference in its entirety.

TECHNICAL FIELD

The present application relates to the field of semiconductor technology, more specifically to chip package structures and methods for manufacturing chip package structures.

BACKGROUND

The fabrication of semiconductor chips usually includes fabricating device structures and circuits based on wafers and cutting wafers. The chip formed by wafer cutting can be coupled to a carrier such as a lead frame or a package base board, and the chip is packaged through chip packaging technology to avoid the chip contacting with the external world and prevent damage to the chip from the external world. With the rapid development of optoelectronic and microelectronic manufacturing technique, electronic products are always developing towards smaller, lighter and cheaper, so the package forms of chip elements are also constantly improved.

BRIEF DESCRIPTION OF THE DRAWINGS

Other features, objects and advantages of the present application will become more apparent by reading the detailed description of the non-limiting examples made with reference to the following drawings, wherein.

DETAILED DESCRIPTION

Figure 1:
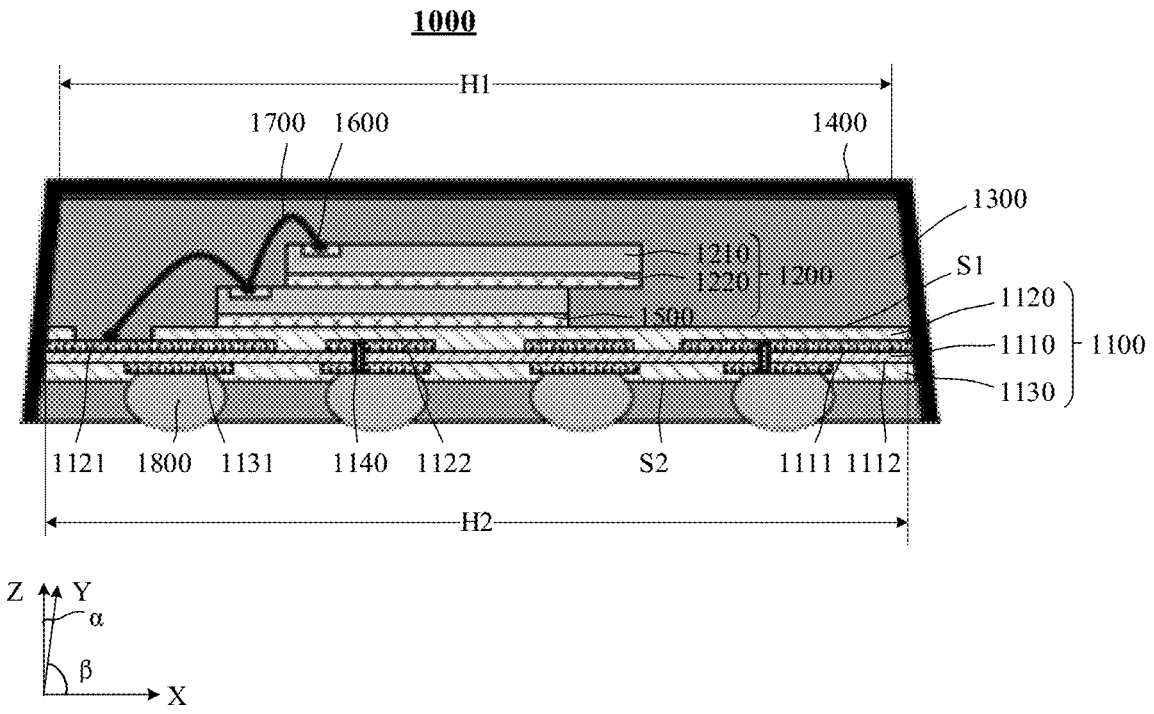
FIG. 1 is a structure schematic diagram of a chip package structure according to an example of the present application.

In order to better understand the present application, various aspects of the present application will be described in more detail with reference to the accompanying drawings. It should be understood that these detailed descriptions are only descriptions of examples of the present application, but do not limit the scope of the present application in any way.

It should be noted that in this specification, the expressions of "first", "second", "third", etc. are only used to distinguish one feature from another one, but do not indicate any limitation to the features, especially not indicate any successively sequence. Therefore, without departing from the teaching of this application, "first surface" discussed in the present disclosure can also be referred to as "second surface", and "first adhesive film" can also be referred to as "second adhesive film", and vice versa.

In the accompanying drawings, the thickness, size and shape of the components have been slightly adjusted for ease of illustration. The accompanying drawings are examples only and are not drawn strictly to scale. As used herein, the terms "approximately", "about", and similar terms are used as terms to express approximation rather than degree, and are intended to explain the inherent deviation in a measured or calculated value that will be recognized by those skilled in the art.

In addition, when describing herein one part being "on" the other part, for example, the meanings of "on", "over" and "above" should be interpreted in the widest way, so that "on" not only means "on" something directly, but also includes the meaning of "on" something with intermediate features or layers therebetween, and "over" and "above" do not absolutely mean to be on top based on the direction of gravity, and not only mean "over" something or "above" something, but it can also include the meaning of "over" something or "above" something without intermediate features or layers therebetween (that is, directly on something).

It should also be understood that the expressions such as "include", "included", "have", "contain" and/or "contained" are open rather than closed expressions in this specification, which indicate the existence of the stated features, elements and/or components, but do not exclude the existence of one or more other features, elements, components and/or combinations thereof. Further, when an expression such as "at least one of . . . " appears after the list of listed features, it modifies the entire list of features rather than just an individual element in the list. In addition, when describing the examples of the present application, "may" is used to indicate "one or more examples of the present application". Further, the term "exemplary" is intended to refer to an example or illustration.

The description will be made herein with reference to the schematic diagrams of the examples. The examples disclosed herein should not be interpreted as being limited to the specific shapes and sizes shown, but include various equivalent structures capable of achieving the same functions, and shape and size deviations resulting from, for example, manufacture. The positions shown in the accompanying drawings are schematic in nature and are not intended to limit the positions of the respective components.

Unless otherwise defined, all terms used herein (including technical terms and scientific terms) have the same meaning as those generally understood by those skilled in the art to which the present disclosure belongs. Terms such as those defined in common dictionaries shall be interpreted as having the same meaning as their meaning in the context of the relevant field, and will not be interpreted in an idealized or overly formalized sense, unless explicitly so defined herein.

As used herein, the term "layer" refers to a material part including a region having a height. The layer can be a region of homogenous or inhomogeneous continuous structure, and its height is less than the height of the continuous structure. For example, a layer can be located between any pair of horizontal planes between, or at, a top surface and a bottom surface of the continuous structure. A layer can extend horizontally, vertically, and/or along a tapered surface. A base board can be a layer, can include one or more layers therein, and/or can have one or more layers thereupon, thereabove, and/or therebelow. A layer can include multiple layers.

It should be noted that the examples and features in the examples in the present application can be combined with each other without conflict. In addition, unless explicitly defined or contrary to the context, the specific explanation of the method recited in the present application need not be limited to the order the method is explained, but can be performed in any order or in parallel. The present application will be described in detail below with reference to the accompanying drawings and in combination with examples.

In addition, when "connection" or "coupling" is used in this application, it can indicate that the corresponding components are in direct contact or indirect contact, unless there are other explicit limitations or can be derived from the context.

If, during operation, a circuit in a chip is exposed to electromagnetic interference (EMI) from the external world during operation, the operation efficiency may be affected. In addition to various interference sources from the external world, in the design of high-speed printed circuit boards (PCBs) and systems, high-frequency signal lines, pins of integrated circuits, and various connectors may also become radiation interference sources with antenna characteristics. These devices can emit electromagnetic waves, which may affect the normal operation of various devices, including chip package structure, in the system.

For example, with the advent of the era of 5G communication (communication of electronics such as 5G smart phones), the transmission rate, frequency and signal strength of the electronics will be significantly improved. The introduction of high frequency and the increase of the number of antennas will all lead to the increase of electromagnetic interference in the electronics, which tends to reduce or destroy the performance of the electronics. In addition, with the continuous development of automotive electronic control technology, the number of on-board electronics has greatly increased, the operation frequency has gradually increased, and the power has gradually increased, making the automotive operation environment full of electromagnetic waves and the sensitivity of on-board electronics to electromagnetic waves significantly increased. It can be seen that, with the rapid development of many fields, the market demand for chip package structure with magnetic shielding is more and more urgent.

FIG. 1 is a structure schematic diagram of a chip package structure 1000 according to an example of the present application.

As shown in FIG. 1, the chip package structure 1000 may include a base board 1100, a chip assembly 1200, a package body 1300, and a shielding layer 1400.

The baseboard 1100 may include a grounding pad 1121. The chip assembly 1200 may be located at the first surface S1 of the base board 1100. The package body 1300 may cover the chip assembly 1200. The width H1 of the surface of the package body 1300 away from the base board 1100 along the second direction X parallel to the base board 1100 may be less than the width H2 of the surface of the package body 1300 close to the base board 1100 along the second direction X, that is, H1 and H2 may meet H1<H2. In the package body 1300, its side wall can be used to connect the surface away from the base board 1100 and the surface close to the base board 1100. The side wall of the package body 1300 may be located in the extension direction Y of the side wall of the base board 1100, that is, the side wall of the package body 1300 and the side wall of the base board 1100 are in the same plane. The side wall of the package body 1300 and the first surface S1 of the base board 1100 may have an acute included angle β therebetween, that is, β meets β<90°. In other words, the side walls of the package body 1300 and the base board 1100 may be disposed obliquely to the side of the chip assembly 1200. The extension direction Y may have an included angle α with the first direction Z perpendicular to the base board 1100, that is, the sum of α and β can be about 90°. The shielding layer 1400 can cover the side walls of the package body 1300 and the base board 1100, and can be electrically connected with the grounding pad 1121 to isolate the transmission of electromagnetic waves and realize the electromagnetic shielding of the chip.

In the example of the present application, the base board 1100 may include a substrate 1110, a first dielectric layer 1120, and a second dielectric layer 1130. The first dielectric layer 1120 may be located at the first surface 1111 of the substrate 1110. The second dielectric layer 1130 may be located at the second surface 1112 of the substrate 1110 opposite the first surface 1111.

The first dielectric layer 1120 may include a plurality of grounding pads 1121 and conductive pads 1122 disposed on the first surface 1111 of the substrate 1110. The second dielectric layer 1130 may include a plurality of solder pads 1131 disposed on the second surface 1112 of the substrate 1110. For example, the materials of the grounding pad 1121, the conductive pad 1122, and the solder pad 1131 may each include metals, such as copper, aluminum, tungsten, gold, or a combination thereof.

For example, the base board 1100 may also include a plurality of conductive plugs 1140 for connecting the grounding pad 1121 and the solder pad 1131, and connecting the conductive pad 1122 and the solder pad 1131. In other words, the conductive plug 1140 can be used to realize the electrical connection between the grounding pad 1121 and the solder pad 1131, and the electrical connection between the conductive pad 1122 and the solder pad 1131. For example, the material of the conductive plug 1140 may include metal, such as copper, aluminum, tungsten, gold, or a combination thereof.

In the example of the present application, the chip assembly 1200 may be located at the first surface S1 of the base board 1100. For example, when the base board 1100 includes the first dielectric layer 1120, the first surface of the first dielectric layer 1120 may coincide with the first surface S1 of the base board 1100. In this case, it can be understood that the chip assembly 1200 may be located at the first surface S1 of the first dielectric layer 1120. For example, the chip assembly 1200 may include a plurality of chips 1210 stacked and a first adhesive film 1220 located between two adjacent chips 1210. The plurality of chips 1210 in the chip assembly 1200 can be stacked in the form of staircase, that is, the plurality of chips 1210 are stacked and form a step structure with each other, so as to provide a space for the subsequently formed ground pad 1600 and conductive connection line 1700, such as making the ground pad 1600 be on the step surface; alternatively, a plurality of chips 1210 may be stacked vertically on each other, and the subsequently formed conductive connection line 1700 may penetrate through the chips; alternatively, the plurality of chips 1210 may also be laterally separated to provide a space for the subsequently formed ground pad 1600 and conductive connection line 1700. It should be understood that the present application does not specifically limit the stacking way of the chips 1210 in the chip assembly 1200. The first adhesive film 1220 may be used for the adhesion of two adjacent chips 1210.

In the example of the present application, the chip package structure 1000 may further include a second adhesive film 1500 located between the base board 1100 and the chip 1210 closest to the base board 1100. The second adhesive film 1500 may be used for the adhesion of the chip 1210 closest to the base board 1100 and the base board 1100, so that the chip assembly 1200 is adhered to the first surface S1 of the base board 1100 through the second adhesive film 1500. For example, the second adhesive film 1500 may be located only within the projection area of the chip 1210 closest to the base board 1100 on the base board 1100.

In the example of the present application, the chip package structure 1000 may also include a ground pad 1600 and a conductive connection line 1700. The ground pad 1600 may be located at an area of each chip 1210 that is not covered by other chips. The conductive connection line 1700 can electrically connect the grounding pad 1121 and the ground pad 1600. For example, a plurality of chips 1210 are vertically stacked on the base board 1100 and have a specific horizontal displacement from each other, so that the ground pad 1600 disposed on the top surface of each chip 1210 is exposed for further wire bonding. For example, the ground pad 1600 exposed on the top surface of the chip 1210 can be connected to the corresponding grounding pad 1121 by wire bonding using the conductive connection line 1700. It should be understood that the present application does not specifically limit the numbers of chip assemblies 1200 and chips 1210 contained in each chip assembly 1200. The numbers of chip assemblies 1200 and chips 1210 contained in each chip assembly 1200 may be reasonably set according to the actual demand.

In the present application, electrical connections can be provided for a plurality of chips 1210 and a plurality of semiconductor devices (not shown) by disposing a ground pad 1600, a conductive connection line 1700, a grounding pad 1121, a conductive pad 1122, a conductive plug 1140, a solder pad 1131, and the like. In this way, electrical signals can be transmitted between different components such as the chip 1210 and the semiconductor device. It should be understood that the plurality of semiconductor devices may include a semiconductor device electrically connected with a part of solder pad 1131.

In the example of the present application, the package body 1300 may cover the chip assembly 1200 to seal the chip assembly 1200 disposed at the first surface S1 of the first dielectric layer 1120. For example, the package body 1300 may cover the surfaces of a plurality of chip assemblies 1200, conductive connection lines 1700 and grounding pads 1121. The package body 1300 not only has a mechanical protection effect, but also can prevent external moisture and dust from entering the plurality of chip assemblies 1200, conductive connection lines 1700 and grounding pads 1121. For example, the package body 1300 may be formed of any suitable material, such as a silicon oxide filler or a resin. As an option, the package body 1300 may include an epoxy molding compound (EMC).

In the example of the present application, the side wall of the package body 1300 may be located in the extension direction Y of the side wall of the base board 1100. For example, the side wall of the package body 1300 and the first surface S1 of the base board 1100 may have an acute included angle β therebetween, that is, β may meet β<90°. The width H1 of the surface of the package body 1300 away from the base board 1100 along the second direction X parallel to the base board 1100 may be less than the width H2 of the surface of the package body 1300 close to the base board 1100 along the second direction X, that is, H1 and H2 may meet H1<H2. The extension direction Y may have an included angle α with the first direction Z (i.e., the vertical direction) perpendicular to the base board 1100, that is, the sum of α and β can be about 90°. For example, the acute included angle β can be in the range of 70°~90°, such as in the range of 75°~90°. The included angle α can be in the range of 0°~20°, such as in the range of 0°~15°.

In the present application, β is set as being less than 90° or α is set as being greater than 0°, that is, the side wall direction of the package body 1300 is disposed obliquely to the side of the chip assembly 1200 relative to the vertical direction. In this way, it is beneficial to make the package body 1300 and the base board 1100 as a whole form a structure similar to a regular trapezoid, so that in the subsequent process of forming a shielding layer 1400 (including metal materials) on the side walls of the package body 1300 and the base board 1100, when sputtering metal materials onto the side walls with a certain slope, the metal materials can be attached to the side walls in a point contact manner as much as possible to reduce the flow of metal materials on the side walls, reduce the risk of side wall abrasion, improve the yield, improve the uniformity of the thickness of the shielding layer 1400 on the side wall, and improve the electromagnetic shielding effect.

For example, the metal material may be sputtered vertically from the side of the package body 1300 away from the surface of the base board 1100 to the side walls of the package body 1300 and the base board 1100. In the present application, by setting H1<H2, the package body 1300 and the base board 1100 can be made to be a structure similar to a regular trapezoid as a whole, and then the metal material can be better attached to the side walls of the package body 1300 and the base board 1100. In other words, by setting the package body 1300 and the base board 1100 as a whole being a structure similar to a regular trapezoid, the metal material can be attached to all the side walls of the package body 1300 and the base board 1100, so as to reduce the phenomenon that the metal material is only attached to the side wall of the package body 1300 or only to a part of the side walls of the package body 1300 and the base board 1100.

In the example of the application, the shielding layer 1400 can cover the side walls of the package body 1300 and the base board 1100, and can be electrically connected with the grounding pad 1121, that is, the shielding layer 1400 can be electrically connected with the surface of the grounding pad 1121 exposed at the side wall of the base board 1100. In other words, the shielding layer 1400 may cover the side walls of the package body 1300, the first dielectric layer 1120, the substrate 1110, and the second dielectric layer 1130, and may be electrically connected with the surface of the grounding pad 1121 exposed at the side wall of the first dielectric layer 1120. It should be understood that in the actual forming process, the shielding layer 1400 may also cover the top surface of the package body 1300 near the chip assembly 1200. By electrically connecting the shielding layer 1400 with the grounding pad 1121, the present application can isolate the transmission of electromagnetic waves and realize the electromagnetic shielding effect to the chip 1210.

In the example of the present application, the chip package structure 1000 may also include an electrical connection structure 1800 located on the second surface S2 of the base board 1100 opposite the first surface S1. For example, the electrical connection structure 1800 may be disposed on the solder pad 1131. The material of the electrical connection structure 1800 may include metal, such as tin. The electrical connection structure 1800 can be electrically connected with the solder pad 1131. The electrical connection structure 1800 may include at least one of a solder ball, a metal bump, and a conductive adhesive structure.

In the present application, the electrical connection structure 1800 can be electrically connected with the chip 1210 through the base board 1100, so that the electrical connection structure 1800 can be used as an electrical connector between the chip package structure 1000 and an external circuit/device. For example, the electrical connection structure 1800 may be electrically connected with the chip 1210 through a solder pad 1131, a conductive plug 1140, a grounding pad 1121, a conductive pad 1122, and the like in the base board 1100. The chip package structure 1000 provided by the present application can be connected to an external circuit such as a printed circuit board (PCB) through a plurality of electrical connection structures 1800, so as to realize the integration of a plurality of chip package structures 1000 (each including a plurality of chips) on a single PCB.

In the example of the present application, the package body 1300 may also cover the second surface S2 of the base board 1100. For example, when the base board 1100 includes a second dielectric layer 1130, the surface of the second dielectric layer 1130 close to the electrical connection structure 1800 may coincide with the second surface S2 of the base board 1100. In this case, it can be understood that the package body 1300 can also cover the surface 1131 of the second dielectric layer 1130 close to the electrical connection structure 1800. For example, the package body 1300 may cover a part of the electrical connection structure 1800 so that another part thereof is exposed to the exterior of the package body 1300 to facilitate the connection of the exposed part of the electrical connection structure 1800 to the external components. For example, the chip package structure 1000 may be connected to a printed circuit board (PCB) through the exposed part of the electrical connection structure 1800.

In the present application, by setting the package body 1300 to cover a part of the electrical connection structure 1800, it is not only conducive to improving the mechanical strength of the base board 1100, but also conducive to making the stress uniformly distributed during the packaging process, so as to reduce the warpage and/or fracture caused by the uneven distribution of stress. In addition, by setting the package body 1300 to cover the surface 1131 of the second dielectric layer 1130 close to the electrical connection structure 1800, the second dielectric layer 1130 can be protected during the manufacturing and packaging process, and damage to the second dielectric layer 1130, such as scratches, dents, discoloration, etc., can be avoided.

Figure 2:
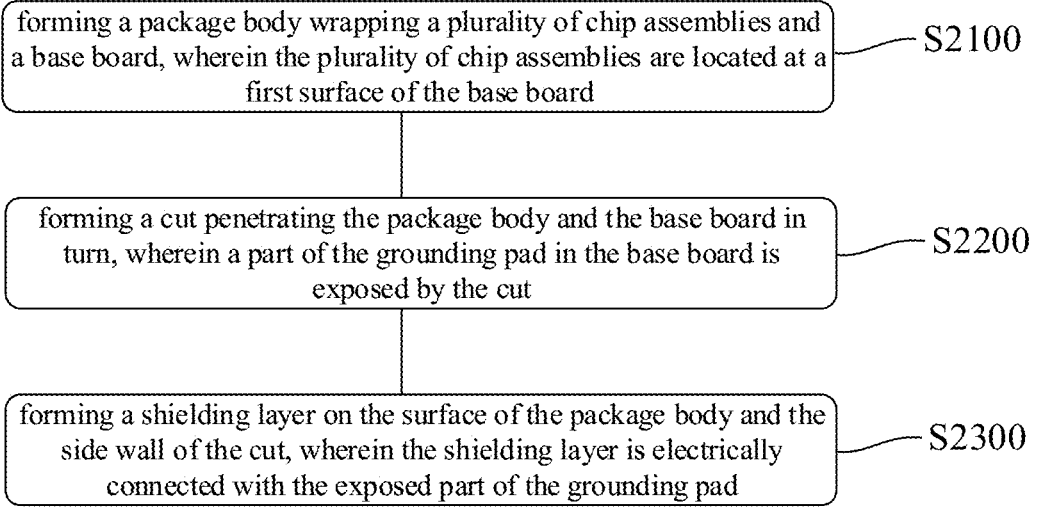
FIG. 2 is a flowchart of a method for manufacturing a chip package structure according to an example of the present application.

FIG. 2 is a flowchart of a method 2000 for manufacturing a chip package structure according to an example of the present application.

As shown in FIG. 2, the method 2000 for manufacturing a chip package structure may include: S2100, forming a package body wrapping a plurality of chip assemblies and a base board, wherein the plurality of chip assemblies are located at a first surface of the base board; S2200, forming a cut penetrating the package body and the base board in turn, wherein a part of the grounding pad in the base board is exposed by the cut; and S2300, forming a shielding layer on the surface of the package body and the side wall of the cut, wherein the shielding layer is electrically connected with the exposed part of the grounding pad. S2100 to S2300 will be described in detail below.

Figure 3:
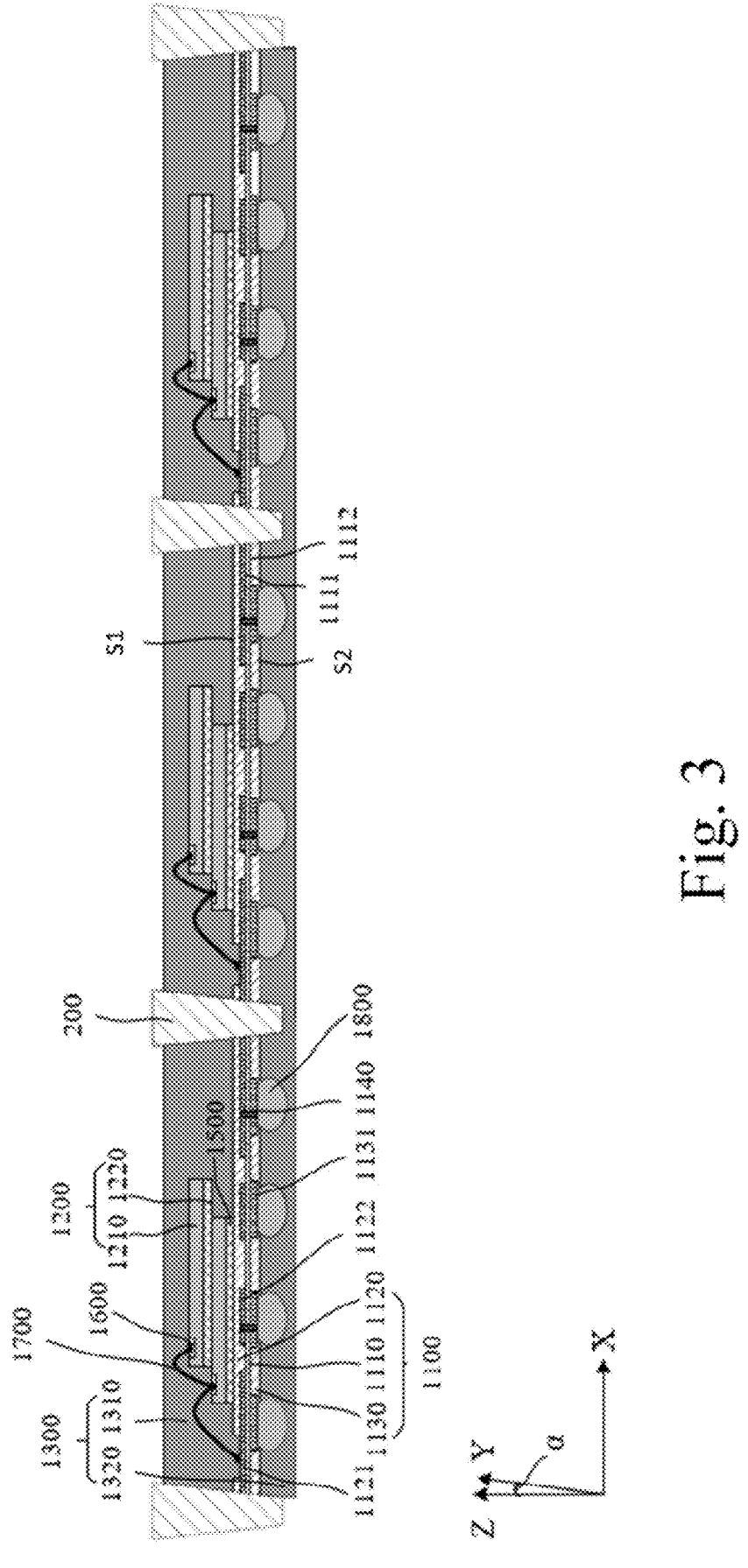
FIGS. 3 to 7 are process diagrams for manufacturing a chip package structure according to an example of the present application.

In the example of the present application, as shown in FIG. 3, a package body 1300 wrapping a plurality of chip assemblies 1200 and a base board 1100 may be formed, wherein the plurality of chip assemblies 1200 may be located at the first surface S1 of the base board 1100.

For example, the base board 1100 may include a substrate 1110, a first dielectric layer 1120, and a second dielectric layer 1130. The first dielectric layer 1120 may be located at a first surface 1111 of the substrate 1110. The second dielectric layer 1130 may be located at a second surface S2 of the substrate 1110 opposite the first surface 1111.

The first dielectric layer 1120 may include a plurality of grounding pads 1121 and conductive pads 1122 disposed on the first surface 1111 of the substrate 1110. The second dielectric layer 1130 may include a plurality of solder pads 1131 disposed on the second surface 1112 of the substrate 1110. For example, the materials of the grounding pad 1121, the conductive pad 1122, and the solder pad 1131 may each include a metal, such as copper, aluminum, tungsten, gold, or a combination thereof.

For example, the base board 1100 may also include a plurality of conductive plugs 1140 for connecting the grounding pad 1121 and the solder pad 1131, the conductive pad 1122 and the solder pad 1131. The conductive plug 1140 can be used to realize the electrical connection between the grounding pad 1121 and the solder pad 1131, and the electrical connection between the conductive pad 1122 and the solder pad 1131. For example, the material of the conductive plug 1140 may include a metal, such as copper, aluminum, tungsten, gold, or a combination thereof.

It should be noted that in the present application, any suitable process can be used to form the grounding pad 1121, the conductive pad 1122, the solder pad 1131 and the conductive plug 1140.

For example, a plurality of chip assemblies 1200 may be formed at the first surface S1 of the base board 1100. For example, when the base board 1100 includes the first dielectric layer 1120, the first surface of the first dielectric layer 1120 may coincide with the first surface S1 of the base board 1100. In this case, it can be understood that a plurality of chip assemblies 1200 may be formed at the first surface S1 of the first dielectric layer 1120. As shown in FIG. 3, the chip assembly 1200 may include a plurality of chips 1210 stacked and a first adhesive film 1220 located between two adjacent chips 1210. The plurality of chips 1210 in the chip assembly 1200 can be stacked in the form of staircase, that is, the plurality of chips 1210 are stacked and form a step structure with each other, so as to provide a space for the subsequently formed ground pad 1600 and conductive connection line 1700, such as making the ground pad 1600 be on the step surface; alternatively, a plurality of chips 1210 may be stacked vertically on each other, and the subsequently formed conductive connection line 1700 may penetrate through the chips; alternatively, the plurality of chips 1210 may also be laterally separated to provide a space for the subsequently formed ground pad 1600 and conductive connection line 1700. It should be understood that the present application does not specifically limit the stacking way of the chips 1210 in the chip assembly 1200. The first adhesive film 1220 may be used to adhere two adjacent chips 1210. For example, before forming a plurality of chip assemblies 1200, a second adhesive film 1500 may be formed at the first surface S1 of the base board 1100, that is, at the first surface S1 of the first dielectric layer 1120. The second adhesive film 1500 can be used to adhere the chip 1210 closest to the base board 1100 and the base board 1100, so that the chip assembly 1200 is adhered to the first surface S1 of the base board 1100 through the second adhesive film 1500. For example, the projection area of the second adhesive film 1500 on the base board 1100 is approximately the same as that of the chip 1210 closest to the base board 1100 on the base board 1100.

For example, in an area of each chip 1210 that is not covered by other chips, aground pad 1600 may be formed, and a conductive connection line 1700 for electrically connecting the grounding pad 1121 and the ground pad 1600 may be formed. In the present application, a plurality of chips 1210 are vertically stacked on the base board 1100 and have a specific horizontal displacement with each other, so that the ground pad 1600 disposed on the top surface of each chip 1210 is exposed for further wire bonding. For example, the ground pad 1600 exposed on the top surface of the chip 1210 may be connected to the corresponding grounding pad 1121 by wire bonding using the conductive connection line 1700. It should be understood that the present application does not specifically limit the numbers of chip assemblies 1200 and chips 1210 contained in each chip assembly 1200. The numbers of chip assemblies 1200 and chips 1210 contained in each chip assembly 1200 can be reasonably set according to the actual demand.

In the present application, an electrical connection can be provided for a plurality of chips 1210 and a plurality of semiconductor devices (not shown) by providing a ground pad 1600, a conductive connection line 1700, a grounding pad 1121, a conductive pad 1122, a conductive plug 1140, a solder pad 1131, and the like. In this way, electrical signals can be transmitted between different components such as the chip 1210 and the semiconductor device. It should be understood that the plurality of semiconductor devices may include a semiconductor device electrically connected with a part of solder pads 1131.

In the example of the present application, forming the package body 1300 wrapping the plurality of chip assemblies 1200 and the base board 1100 may include forming a first package body 1310 wrapping the surfaces of the plurality of chip assemblies 1200, conductive connection lines 1700, and grounding pads 1121. The first package body 1310 not only has a mechanical protection function, but also can prevent external moisture and dust from entering the plurality of chip assemblies 1200, conductive connection lines 1700 and grounding pads 1121.

For example, an electrical connection structure 1800 may be formed at the second surface S2 of the base board 1100 opposite the first surface S1. For example, when the base board 1100 includes the second dielectric layer 1130, at least one surface of the second dielectric layer 1130 may coincide with the second surface S2 of the base board 1100. In this case, it can be understood that the electrical connection structure 1800 may be formed at at least one surface of the second dielectric layer 1130. For example, the electrical connection structure 1800 may be formed on the solder pad 1131 of the second dielectric layer 1130. The material of the electrical connection structure 1800 may include a metal, such as tin. The electrical connection structure 1800 can be electrically connected with the solder pad 1131. The electrical connection structure 1800 may include at least one of a solder ball, a metal bump, and a conductive adhesive structure.

In the present application, the electrical connection structure 1800 can be electrically connected with the chip 1210 through the base board 1100, so that the electrical connection structure 1800 can be used as an electrical connector between the chip package structure and an external circuit/ device. For example, the electrical connection structure 1800 may be electrically connected with the chip 1210 through the solder pad 1131, the conductive plug 1140, the grounding pad 1121, the conductive pad 1122, and the like in the base board 1100. The chip package structure provided by the present application can be connected to an external circuit such as a printed circuit board (PCB) through a plurality of electrical connection structures 1800, so as to realize the integration of a plurality of chip package structures (each including a plurality of chips) on a single PCB.

In the example of the present application, forming the package body 1300 wrapping a plurality of chip assemblies 1200 and a base boards 1100 may also include forming a second package body 1320 wrapping the electrical connection structure 1800. By setting the second package body 1320 in the present application, it is not only conducive to improving the mechanical strength of the base board 1100, but also conducive to making stress uniformly distributed during the packaging process, so as to reduce warpage and/or fracture caused by uneven stress distribution. In addition, by setting the second package body 1320 to cover the surface of the second dielectric layer 1130 close to the electrical connection structure 1800, the second dielectric layer 1130 can be protected during the manufacturing and packaging process, and damage to the second dielectric layer 1130, such as scratches, dents, discoloration, etc., can be avoided. In addition, in the traditional process, a glue and a film layer wrapping the electrical connection structure 1800 are usually formed, and the glue and the film layer need to be removed in the subsequent process. However, in the present application, the formation of the second package body wrapping the electrical connection structure can eliminate the need to remove the second package body 1320 in the subsequent process, which is conducive to shortening the production cycle, as well as reducing the production cost, reducing the process steps and reducing the risk of the chip being scratched.

For example, the first package body 1310 and the second package body 1320 may be formed of any suitable material, such as a silicon oxide filler or a resin. As an option, the first package body 1310 and the second package body 1320 may include an epoxy molding compound (EMC).

Figure 4:
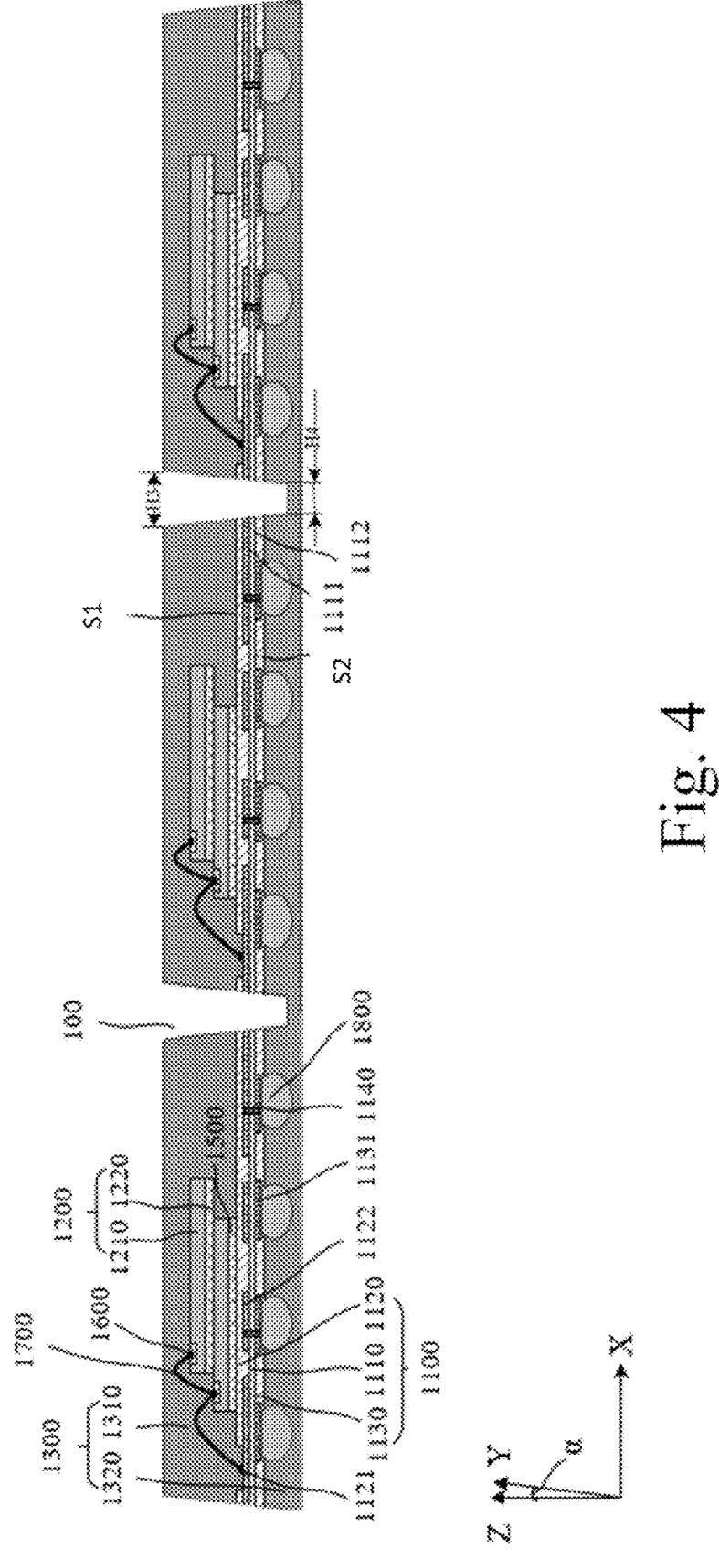

In the example of the present application, as shown in FIG. 4, a cut 100 that penetrates the package body 1300 and the base board 1100 in turn may be formed, wherein a part of the grounding pad 1121 in the base board 1100 is exposed by the cut 100.

For example, forming the cut 100 that penetrates the package body 1300 and the base board 1100 in turn may include forming, between adjacent chip assemblies 1200, a cut 100 that penetrates the first package body 1310 and the base board 1100 in turn and extends to the second package body 1320. The width H3 of the surface of the cut 100 away from the base board 1100 along the second direction X parallel to the base board may be greater than the width H4 of the surface of the cut 100 close to the base board 1100 along the second direction X. As shown in FIG. 3, a trapezoidal blade 200 may be used to cut the package body 1300 and the base board 1100 along a first direction Z perpendicular to the base board 1100 to form a cut 100 penetrating the first package body 1310 and the base board 1100 and extending to the second package body 1320 (FIG. 4). As shown in FIG. 3, the width of the end face of the trapezoidal blade 200 close to the base board 1100 may be less than the width of the end face of the trapezoidal blade 200 away from the base board 1100, wherein the width of the end face may be the size of the end face along the direction parallel to the base board 1100, so that the width H3 of the surface of the formed cut 100 away from the base board 1100 along the second direction X parallel to the base board may be greater than the width H4 of the surface of the cut 100 close to the base board 1100 along the second direction X (FIG. 4).

For example, the cut 100 may be wide at the top and narrow at the bottom, that is, the width of the bottom surface of the cut 100 may be less than the opening size of the cut 100 in the direction away from the base board 1100. The extension direction Y of the side wall of the cut 100 may have an included angle α with the first direction Z perpendicular to the base board. For example, the included angle α is in the range of 0°~20°, such as in the range of 0°~15°. The present application makes α greater than 0°, that is, the side wall direction of the package body 1300 is made obliquely relative to the vertical direction. In this way, in the subsequent process of forming the shielding layer 1400 (including metal materials) on the side walls of the package body 1300 and the base board 1100, when sputtering a metal material to the side walls with a certain slope, the metal material can be attached to the side wall in the form of point contact as much as possible to reduce the flow of the metal material on the side walls, reduce the risk of side wall scratch, improve the yield, improve the thickness uniformity of the shielding layer 1400 on the side walls, and improve the electromagnetic shielding effect.

Figure 5:
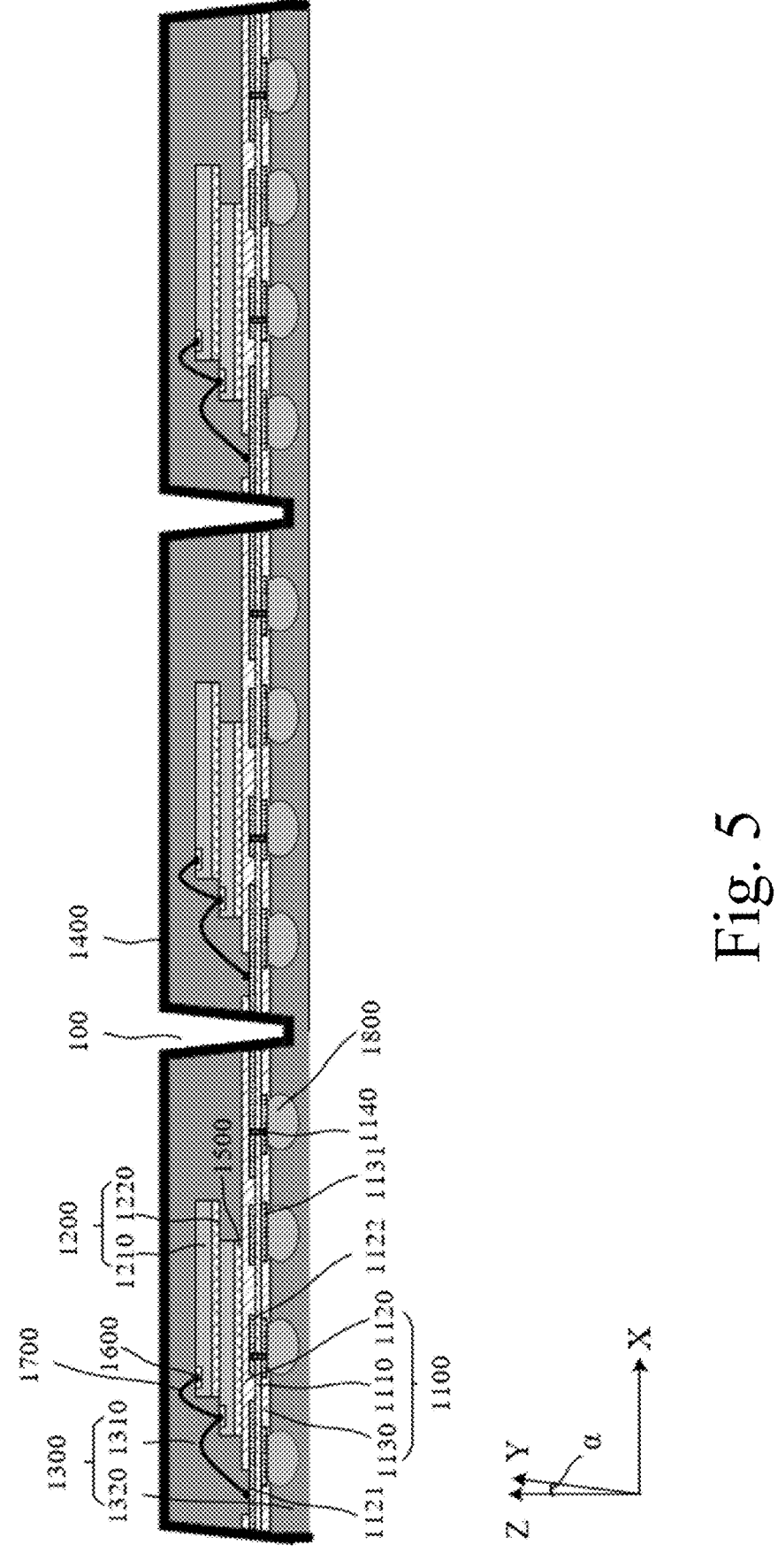

In the example of the present application, as shown in FIG. 5, a shielding layer 1400 may be formed on the surface of the package body 1300 and the side wall of the cut 100. The shielding layer 1400 may be electrically connected with the exposed part of the grounding pad 1121.

For example, the shielding layer 1400 may be formed on the surface of the package body 1300 and the side wall of the cut 100 by a sputtering or spraying process. The formed shielding layer 1400 may cover the surface and side wall of the first package body 1310, the side wall of the base board 1100, and the surface and side wall of the area formed after a part of the second package body 1320 being cut-off. For example, the shielding layer 1400 may be electrically connected with the surface of the grounding pad 1121 exposed at the side wall of the base board 1100. By electrically connecting the shielding layer 1400 with the grounding pad 1121, the present application can isolate the transmission of electromagnetic waves and realize the electromagnetic shielding effect to the chip 1210.

Figure 6:
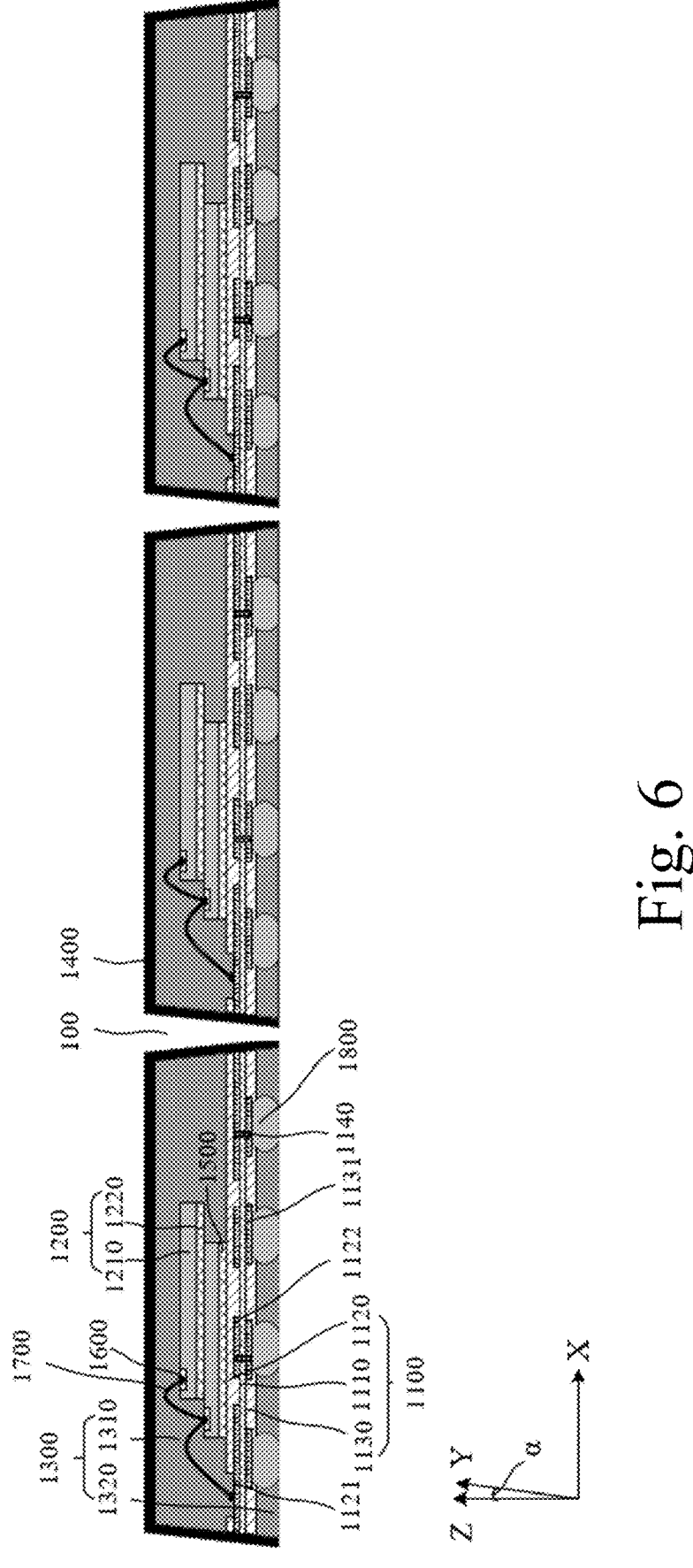

In the example of the present application, as shown in FIG. 6, at least a part of the second package body 1320 and at least a part of the electrical connection structure 1800 can be removed along the second direction X until the second package body 1320 below the cut 100 is completely removed.

For example, the above removal process may be performed by a chemical mechanical polishing (CMP) process or an etching process to form a plurality of independent chip package structures 1000 (refer to FIG. 1). For example, a CMP process may be performed on the surface of the second package body 1320 away from the second dielectric layer 1130 to remove a part of the second package body 1320 and a part of each electrical connection structure 1800 until the second package body 1320 below the cut 100 is completely removed.

Figure 7:
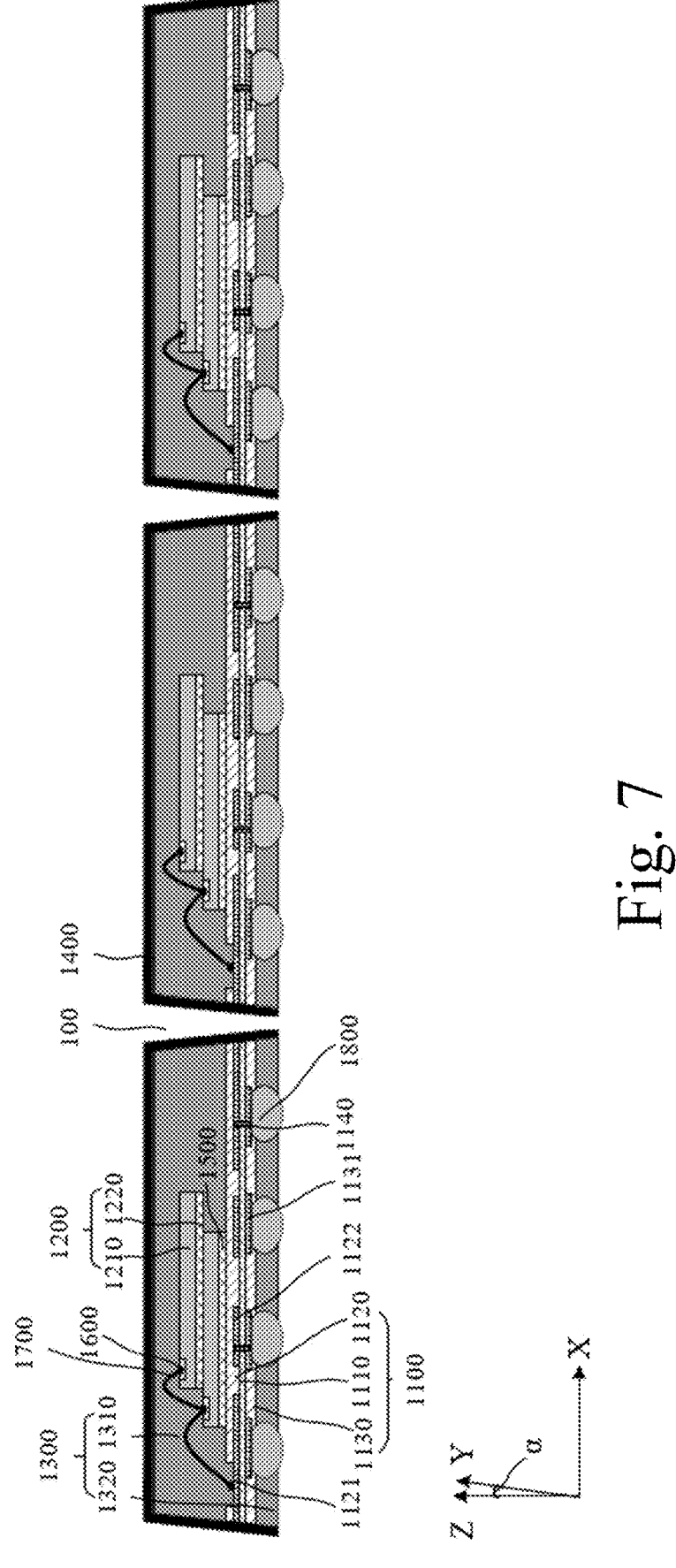

In the example of the present application, as shown in FIG. 7, a reflowing and reshaping process may be performed on the electrical connection structure 1800 (e.g., a tin ball) to form a plurality of reshaped electrical connection structures 1800, and a part of each reshaped electrical connection structure 1800 can protrude from the surface of the second package body 1320 away from the second dielectric layer 1130. For example, after removing a part of each electrical connection structure 1800, a plurality of electrical connection structures 1800 may be reshaped by a tin reflowing process. In the present application, a plurality of reshaped electrical connection structures 1800 protruding from the second package body 1320 can be used to connect the chip package structure to the PCB.

In order to realize electromagnetic shielding in traditional process, firstly, a plurality of electrical connection structures need to be formed on one side of the semiconductor structure with a plurality of chip assemblies; secondly, a glue wrapping the electrical connection structure and a film layer for supporting the glue are disposed on one side of the electrical connection structure; thirdly, the semiconductor structure is cut to form a plurality of separate chip structures to package each chip structure respectively; then, when packaging a chip structure, a shielding layer can be formed on one side of the chip assembly, and all chip structures can be packaged in turn; finally, the film layer and the glue of each chip structure are removed in turn.

Compared with the traditional process, the present application uses the half cutting process, that is, the cut 100 formed will not penetrate through the second package body 1320, and a plurality of chip structures can be packaged at the same time in the subsequent process, which is conducive to reducing the process steps and shortening the production cycle. In addition, in the present application, since the second package body 1320 does not need to be removed, it is not only conducive to shortening the production cycle, but also can reduce the production cost, reduce the process steps and reduce the risk of the chip being scratched. In addition, by setting the side wall of the package body 1300 with a certain slope, the present application is not only conducive to improving the uniformity of the thickness of the shielding layer on the side wall, but also conducive to reducing the risk of the side wall being scratched, and improving the yield of the manufactured chip package structure.

Since the content and structure involved in the above description of the chip package structure 1000 can be fully or partially applicable to the method 2000 for manufacturing the chip package structure described here, the content related to or similar to it will not be repeated here.

The examples proposed in the present application can solve or partially solve the deficiencies proposed in the part of the above background or other deficiencies in the prior art.

The present application provides a chip package structure. The chip package structure includes: a base board including a grounding pad; a chip assembly located at a first surface of the base board; a package body covering the chip assembly, wherein a side wall of the package body is located in an extension direction of a side wall of the base board, and the side wall of the package body and the first surface of the base board have an acute included angle therebetween; and a shielding layer covering the side walls of the package body and the base board and electrically connected with the grounding pad.

In one example, the chip assembly includes: a plurality of chips stacked; and a first adhesive film located between adjacent two of the chips.

In one example, the chip package structure further includes: a ground pad located at an area of each chip that is not covered by other chips; and a conductive connection line electrically connecting the grounding pad and the ground pad.

In one example, the chip package structure further includes: an electrical connection structure located at a second surface of the base board opposite the first surface, wherein the electrical connection structure is electrically connected with the chips through the base board.

In one example, the electrical connection structure includes at least one of a solder ball, a metal bump and a conductive adhesive structure.

In one example, the package body covers the second surface of the base board, and at least a part of the electrical connection structure is exposed to an exterior of the package body.

In one example, the included angle is in the range of 70°~90°.

In one example, the chip package structure further includes: a second adhesive film located between the base board and the chip closest to the base board.

Another aspect of the present application provides example methods for manufacturing a chip package structure. In one example, the method includes: forming a package body wrapping a plurality of chip assemblies and a base board, wherein the plurality of chip assemblies are located at a first surface of the base board; forming a cut penetrating the package body and the base board in turn, wherein a part of the grounding pad in the base board is exposed by the cut; and forming a shielding layer on a surface of the package body and a side wall of the cut, wherein the shielding layer is electrically connected with the exposed part of the grounding pad.

In one example, forming a package body wrapping a plurality of chip assemblies and a base board includes: forming a package body wrapping the plurality of chip assemblies, the first surface, and a second surface of the base board, wherein the second surface is disposed opposite the first surface, and the package body includes a first package body located at a side of the first surface and a second package body located at a side of the second surface.

In one example, forming a cut penetrating the package body and the base board in turn includes: forming, between adjacent chip assemblies, a cut that penetrates the first package body and the base board in turn and extends to the second package body.

In one example, a width of a surface of the cut away from the base board along a second direction parallel to the base board is greater than a width of a surface of the cut close to the base board along the second direction.

In one example, the method includes: using a trapezoidal blade to cut the package body and the base board along a first direction perpendicular to the base board to form the cut.

In one example, the method includes: forming an electrical connection structure on the second surface of the base board, and the electrical connection structure being electrically connected with the chip through the base board, wherein the second package body covers the electrical connection structure.

In one example, the method includes: removing, along a second direction, at least a part of the second package body and at least a part of the electrical connection structure, until the second package body below the cut is completely removed.

In one example, the method includes: performing a reflowing and reshaping process on the electrical connection structure.

In one example, each of the chip assemblies includes a plurality of chips stacked, and the method includes: forming a ground pad at an area of each chip that is not covered by other chips; and forming a conductive connection line for electrically connecting the grounding pad and the ground pad.

In one example, the method includes: forming a first adhesive film between adjacent two of the chips; and forming a second adhesive film between the base board and the chip closest to the base board.

In one or more examples of the present application, by forming a cut penetrating the package body and the base board and forming a shielding layer on the surface of the package body and the side wall of the cut, and making the shielding layer electrically connect with the exposed part of the grounding pad, the cut can be made to not penetrate through the package body, and a plurality of chip assemblies formed by cutting are still connected together, so that the plurality of chip assemblies can be packaged at the same time in the same process, shortening the production cycle, improving process efficiency and saving production costs.

Although an structure and preparation method of the chip package structure are described herein, it is understood that one or more features may be omitted, replaced, or added from the preparation method of the chip package structure. In addition, the illustrated layers and their materials are only exemplary.

The above description is only a description of examples of the application and the applied technical principles. Those skilled in the art would understand that the scope of the invention involved in the present application is not limited to the technical solutions formed by the specific combination of the above technical features, but also covers other technical solutions formed by the arbitrary combination of the above technical features or their equivalent features without departing from the inventive concept, for example, the technical solutions formed by replacing of the above features and (but not limited to) the technical features with similar functions disclosed in the application with each other.

The invention claimed is:

1. A method for manufacturing a chip package structure, the method comprising:

forming a package body wrapping a plurality of chip assemblies and a base board, wherein the plurality of chip assemblies are located at a first surface of the base board;

forming a cut penetrating the package body and the base board in turn, wherein a part of a grounding pad in the base board is exposed by the cut, and wherein a width of a surface of the cut away from the base board along a direction parallel to the base board is greater than a width of a surface of the cut close to base board along the direction; and forming a shielding layer on a surface of the package body and a side wall of the cut, wherein the shielding layer is electrically connected with the exposed part of the grounding pad.

2. The method of claim 1, wherein forming the package body wrapping the plurality of chip assemblies and the base board includes forming the package body wrapping the plurality of chip assemblies, the first surface, and a second surface of the base board, wherein the second surface is disposed opposite the first surface, and wherein the package body includes a first package body located at a side of the first surface and a second package body located at a side of the second surface.

3. The method of claim 2, wherein forming the cut penetrating the package body and the base board in turn includes forming, between adjacent chip assemblies of the plurality of chip assemblies, the cut that penetrates the first package body and the base board in turn and extends to the second package body.

4. The method of claim 1, further including using a trapezoidal blade to cut the package body and the base board along a direction perpendicular to the base board to form the cut.

5. The method of claim 2, further including forming an electrical connection structure on the second surface of the base board, the electrical connection structure being electrically connected with the plurality of chip assemblies through the base board, wherein the second package body covers the electrical connection structure.

6. The method of claim 5, further including removing, along a first direction, at least a part of the second package body and at least a part of the electrical connection structure until the second package body below the cut is completely removed.

7. The method of claim 5, further including performing a reflowing and reshaping process on the electrical connection structure.

8. The method of claim 1, wherein a chip assembly of the plurality of chip assemblies includes a plurality of chips stacked, and the method includes:

forming a ground pad at an area of a chip of the plurality of chips that is not covered by other chips; and forming a conductive connection line for electrically connecting the grounding pad and the ground pad.

9. The method of claim 8, further including:

forming a first adhesive film between an adjacent two of the plurality of chips; and forming a second adhesive film between the base board and a chip of the plurality of chips closest to the base board.

10. A method for manufacturing a chip package structure, the method comprising:

forming a package body wrapping a plurality of chip assemblies and a base board, wherein the plurality of chip assemblies are located at a first surface of the base board, and wherein the package body includes a first package body located at a side of the first surface and a second package body located at a side of a second surface disposed opposite to the first surface;

forming a cut penetrating the package body and the base board in turn, wherein a part of a grounding pad in the base board is exposed by the cut, and wherein forming the cut includes forming, between adjacent chip assemblies of the plurality of chip assemblies, the cut to penetrate the first package body and the base board in turn and extend to the second package body; and forming a shielding layer on a surface of the package body and a side wall of the cut, wherein the shielding layer is electrically connected with the exposed part of the grounding pad.

11. The method of claim 10, wherein a width of a surface of the cut away from the base board along a direction parallel to the base board is greater than a width of a surface of the cut close to the base board along the direction.

12. The method of claim 11, further including using a trapezoidal blade to cut the package body and the base board along a direction perpendicular to the base board to form the cut.

13. The method of claim 10, further including forming an electrical connection structure on the second surface of the base board, the electrical connection structure being electrically connected with the plurality of chip assemblies through the base board, wherein the second package body covers the electrical connection structure.

14. The method of claim 13, further including removing, along a first direction, at least a part of the second package body and at least a part of the electrical connection structure until the second package body below the cut is completely removed.

15. The method of claim 13, further including performing a reflowing and reshaping process on the electrical connection structure.

16. The method of claim 10, wherein a chip assembly of the plurality of chip assemblies includes a plurality of chips stacked, and the method includes:

forming a ground pad at an area of a chip of the plurality of chips that is not covered by other chips; and forming a conductive connection line for electrically connecting the grounding pad and the ground pad.

17. The method of claim 16, wherein the method includes:

forming a first adhesive film between an adjacent two of the plurality of chips; and forming a second adhesive film between the base board and a chip of the plurality of chips closest to the base board.

18. A method for manufacturing a chip package structure, the method comprising:

forming a package body wrapping a plurality of chip assemblies and a base board, wherein the plurality of chip assemblies are located at a first surface of the base board, and wherein the package body includes a first package body located at a side of the first surface and a second package body located at a side of a second surface disposed opposite to the first surface;

forming a cut penetrating the package body and the base board in turn, wherein a part of a grounding pad in the base board is exposed by the cut;

forming a shielding layer on a surface of the package body and a side wall of the cut, wherein the shielding layer is electrically connected with the exposed part of the grounding pad; and forming an electrical connection structure on the second surface of the base board, the electrical connection structure being electrically connected with the plurality of chip assemblies through the base board, wherein the second package body covers the electrical connection structure.

19. The method of claim 18, wherein forming the cut penetrating the package body and the base board in turn includes forming, between adjacent chip assemblies of the plurality of chip assemblies, the cut that penetrates the first package body and the base board in turn and extends to the second package body.

20. The method of claim 18, wherein a width of a surface of the cut away from the base board along a direction parallel to the base board is greater than a width of a surface of the cut close to the base board along the direction.

* * * * *